United States Patent
Kim (10) Patent No.: US 10,217,739 B2
(45) Date of Patent: Feb. 26, 2019

(54) BIPOLAR JUNCTION TRANSISTOR AND METHOD OF MANUFACTURING THE SAME

(71) Applicant: DONGBU HITEK CO., LTD., Seoul (KR)

(72) Inventor: Joo Hyung Kim, Seoul (KR)

(73) Assignee: DB Hitek Co., Ltd, Seoul (KR)

( * ) Notice: Subject to any disclaimer, the term of this patent is extended or adjusted under 35 U.S.C. 154(b) by 0 days.

(21) Appl. No.: 15/497,386

(22) Filed: Apr. 26, 2017

(65) Prior Publication Data

US 2017/0309620 A1 Oct. 26, 2017

(30) Foreign Application Priority Data

Apr. 26, 2016 (KR) .......................... 10-2016-0050756

(51) Int. Cl.

| H01L 27/082 | (2006.01) |
| H01L 29/735 | (2006.01) |
| H01L 29/08 | (2006.01) |
| H01L 29/10 | (2006.01) |
| H01L 29/06 | (2006.01) |
| H01L 29/66 | (2006.01) |

(52) U.S. Cl.
CPC ........ *H01L 27/082* (2013.01); *H01L 29/0649* (2013.01); *H01L 29/0692* (2013.01); *H01L 29/0813* (2013.01); *H01L 29/0821* (2013.01); *H01L 29/1008* (2013.01); *H01L 29/6625* (2013.01); *H01L 29/735* (2013.01)

(58) Field of Classification Search
CPC ............... H01L 27/082; H01L 29/0649; H01L 29/0813; H01L 29/0826; H01L 29/1008; H01L 29/6625; H01L 29/082
See application file for complete search history.

(56) References Cited

U.S. PATENT DOCUMENTS

| 5,323,050 A * | 6/1994 | Ristic ................. G01R 33/0088 257/414 |
| 5,605,850 A * | 2/1997 | Villa .................. H01L 29/1004 148/DIG. 10 |
| 8,115,280 B2 * | 2/2012 | Chen .................. H01L 21/8224 257/593 |

(Continued)

FOREIGN PATENT DOCUMENTS

| KR | 1020000076438 A | 12/2000 |
| WO | WO98/42019 | 9/1998 |

OTHER PUBLICATIONS

Application and Filing Receipt for U.S. Appl. No. 15/370,154, filed Dec. 6, 2016. Inventor: Kim.

*Primary Examiner* — Wael Fahmy
*Assistant Examiner* — Sarah Salerno
(74) *Attorney, Agent, or Firm* — Patterson Thuente Pederson, P.A.

(57) ABSTRACT

A bipolar junction transistor having a relatively reduced size and an improved current gain and a method of manufacturing the same are disclosed. The bipolar junction transistor includes a plurality of emitter regions disposed in a substrate, a plurality of base regions disposed in the substrate and configured to surround the emitter regions, respectively, and a collector region disposed in the substrate and configured to surround the base regions. The plurality of emitter and base regions may be arranged in a matrix.

17 Claims, 8 Drawing Sheets

(56) References Cited

U.S. PATENT DOCUMENTS

2001/0038139 A1* 11/2001 Takiguchi ........... H01L 27/0823
 257/565
2012/0032303 A1* 2/2012 Elkareh ............. H01L 29/41708
 257/587
2017/0125401 A1 5/2017 Gu et al.

* cited by examiner

BIPOLAR JUNCTION TRANSISTOR AND METHOD OF MANUFACTURING THE SAME

CROSS-REFERENCE TO RELATED APPLICATION

This application claims the priority benefit of Korean Patent Application No. 10-2016-0050756, filed on Apr. 26, 2016, and all the benefits accruing therefrom under 35 U.S.C. § 119, the contents of which are incorporated by reference in their entirety.

BACKGROUND

The present disclosure relates to a bipolar junction transistor and a method of manufacturing the same, and more particularly, to a bipolar junction transistor (BJT) having a relatively reduced size and an improved current gain (hfe) and a method of manufacturing the same.

A bipolar junction transistor has a lower noise level than a Metal Oxide Semiconductor Field Effect Transistor (MOSFET). Further, the bipolar junction transistor shows a wide range of linear gain and has excellent frequency response characteristics and current driving capability.

The bipolar junction transistor includes an emitter, a base, and a collector, with device isolation regions being disposed between the emitter, the base, and the collector.

A conventional bipolar junction transistor of the prior art may include an emitter region that is formed within a substrate with ring-shaped base region surrounding the emitter region, and a ring-shaped collector region surrounding the base region. Further, a conventional bipolar junction transistor of the prior art may include a ring-shaped second base region surrounding the collector region, and the first base second base regions may be electrically connected by a deep well region.

A conventional bipolar junction transistor of the prior art may further include a ring-shaped second well region configured to surround the second base region, with a well contact region being disposed on the second well region. Further, the second well region and the well contact region may be used to apply a bias voltage to the substrate. Further, device isolation regions may be disposed between the emitter contact region, the collector contact region, the base contact region, and the well contact region.

A conventional bipolar junction transistor of the prior art may further include an insulating layer that is disposed on the substrate, with metal wiring disposed on the insulating layer to provide electrical connection to the emitter, collector, base, and well contact regions. The construction of the conventional bipolar junction transistor of the prior art is described in greater detail in the detailed description, below.

A conventional bipolar junction transistor array of the prior art may be formed by connecting a plurality of bipolar junction transistors with each other, thereby improving the current gain of the bipolar junction transistor array. However, a disadvantage of this technique of the prior art is that the size of the bipolar junction transistor array may be increased in proportion to the number of the bipolar junction transistors connected with each other. This technique has the disadvantage of requiring a greater physical size for the transistor array where it is otherwise desirable to minimize size.

SUMMARY

The present disclosure overcomes the disadvantage of the prior art in providing a bipolar junction transistor having a relatively reduced size and an improved current gain, and a method of manufacturing the same.

In accordance with an aspect of the present disclosure, a bipolar junction transistor may include a plurality of emitter regions disposed in a substrate; a plurality of base regions disposed in the substrate and configured to surround the emitter regions, respectively; and a collector region disposed in the substrate and configured to surround the base regions.

In accordance with some exemplary embodiments, the collector region may include an outer portion configured to surround outer portions of the base regions; and an inner portion disposed between the base regions.

In accordance with some exemplary embodiments, the emitter regions may be arranged in a matrix form.

In accordance with some exemplary embodiments, four emitter regions may be arranged in a 2×2 matrix form; the base regions may have a ring shape that surrounds the emitter regions, respectively; and the collector region may include a ring-shaped outer portion configured to surround outer portions of the base regions and a cross-shaped inner portion disposed between the base regions.

In accordance with some exemplary embodiments, the bipolar junction transistor may further include a second base region configured to surround the collector region and electrically connected with the base regions.

In accordance with some exemplary embodiments, the bipolar junction transistor may further include a well region disposed in the substrate to electrically connect the first base regions with the second base region.

In accordance with some exemplary embodiments, the first base regions and the second base region may be disposed on the well region.

In accordance with some exemplary embodiments, the bipolar junction transistor may further include device isolation regions disposed on the first base regions.

In accordance with some exemplary embodiments, the bipolar junction transistor may further include a base contact region disposed on the second base region.

In accordance with some exemplary embodiments, the bipolar junction transistor may further include a second well region configured to surround the second base region.

In accordance with some exemplary embodiments, the bipolar junction transistor may further include emitter contact regions disposed on the emitter regions and a collector contact region disposed on the collector region.

In accordance with some exemplary embodiments, the bipolar junction transistor may further include device isolation regions disposed between the emitter contact regions and the collector contact region.

In accordance with another aspect of the present disclosure, a method of manufacturing a bipolar junction transistor may include forming a plurality of emitter regions in a substrate; forming a plurality of base regions in the substrate to respectively surround the emitter regions; and forming a collector region in the substrate to surround the base regions.

In accordance with some exemplary embodiments, the collector region may include an outer portion formed to surround outer portions of the base regions and an inner portion formed between the base regions.

In accordance with some exemplary embodiments, the method of manufacturing a bipolar junction transistor may further include forming a second base region in the substrate to surround the collector region, and the base regions and the second base region may be formed simultaneously.

In accordance with some exemplary embodiments, the method of manufacturing a bipolar junction transistor may further include forming a well region in the substrate to electrically connect the base regions with the second base region.

In accordance with some exemplary embodiments, the method of manufacturing a bipolar junction transistor may further include forming a base contact region on the second base region.

In accordance with some exemplary embodiments, the method of manufacturing a bipolar junction transistor may further include forming a second well region in the substrate to surround the second base region, and the emitter regions, the collector region, and the second well region may be formed simultaneously.

In accordance with some exemplary embodiments, the method of manufacturing a bipolar junction transistor may further include forming emitter contact regions on the emitter regions and forming a collector contact region on the collector region, whereby the emitter contact regions and the collector contact region may be formed simultaneously.

In accordance with some exemplary embodiments, the method of manufacturing a bipolar junction transistor may further include forming device isolation regions between the emitter contact regions and the collector contact region.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Exemplary embodiments can be understood in more detail from the following description taken in conjunction with the accompanying drawings, in which.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present disclosure are described in more detail with reference to the accompanying drawings. However, the present disclosure is not limited to the embodiments described below and is implemented in various other forms. Embodiments below are not provided to fully complete the present disclosure but rather are provided to fully convey the range of the present disclosure to those skilled in the art.

In the specification, when one component is referred to as being on or connected to another component or layer, it can be directly on or connected to the other component or layer, or an intervening component or layer may also be present. By contrast, it will be understood that when one component is referred to as directly being on or directly connected to another component or layer, it means that no intervening component is present. Also, although terms such as a first, a second, and a third are used to describe various regions and layers in various embodiments of the present disclosure, the regions and the layers are not limited to these terms.

The terminology used below is used to merely describe specific embodiments, but they do not limit the present disclosure. Additionally, unless otherwise defined herein, all terms including technical or scientific terms may be taken to have the same meaning that is generally understood by those skilled in the art.

Embodiments of the present disclosure are described with reference to schematic drawings of ideal embodiments. Accordingly, changes in manufacturing methods and/or allowable errors may be expected from the forms of the drawings. Accordingly, embodiments of the present disclosure are not described being limited to the specific forms or areas in the drawings, and include the deviations of the forms. The areas may be entirely schematic, and their forms may not describe or depict accurate forms or structures in any given area, and are not intended to limit the scope of the present disclosure.

Figure 1:
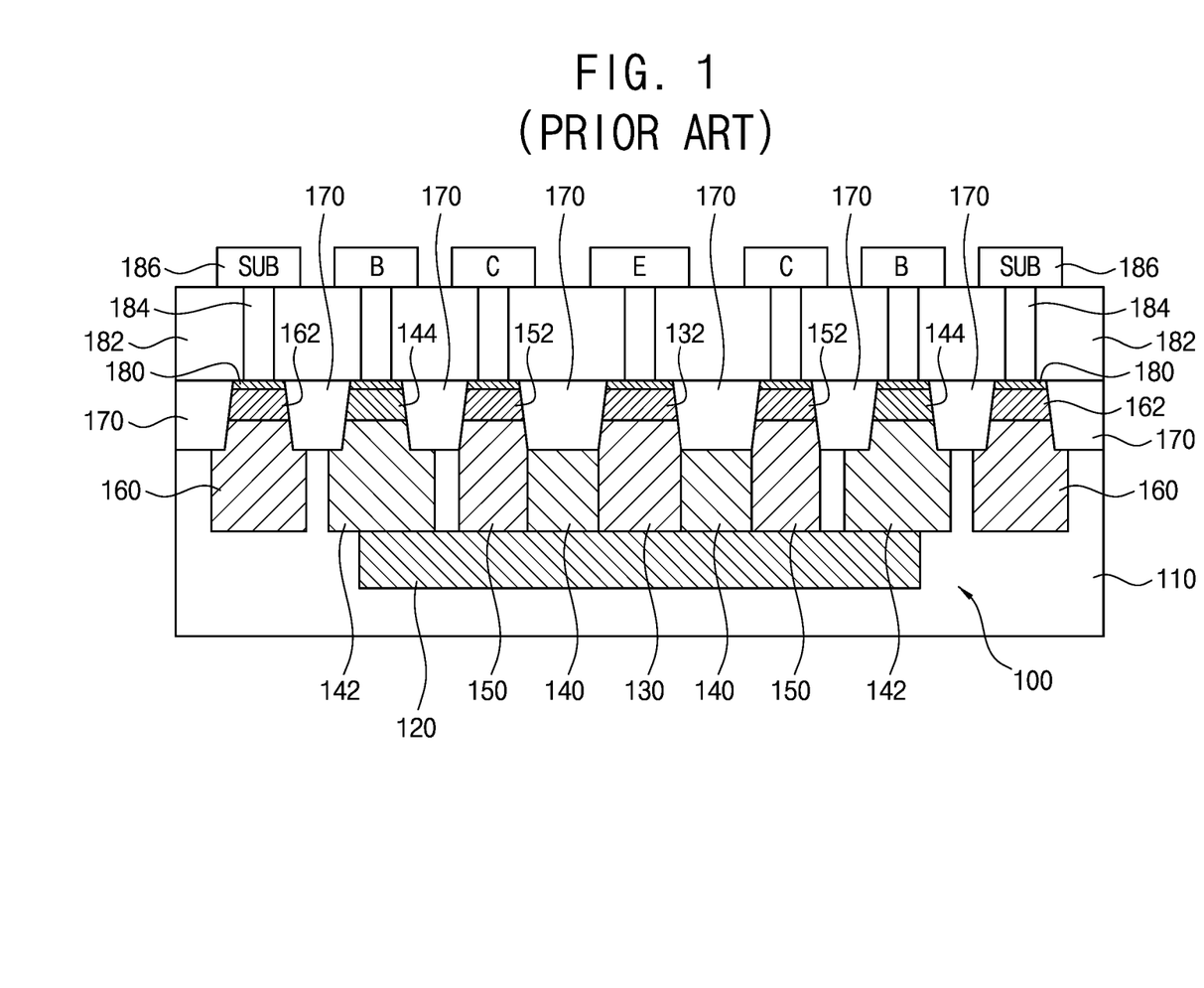
FIG. 1 is a vertical cross-sectional view illustrating a conventional bipolar junction transistor of the prior art.
Figure 2:
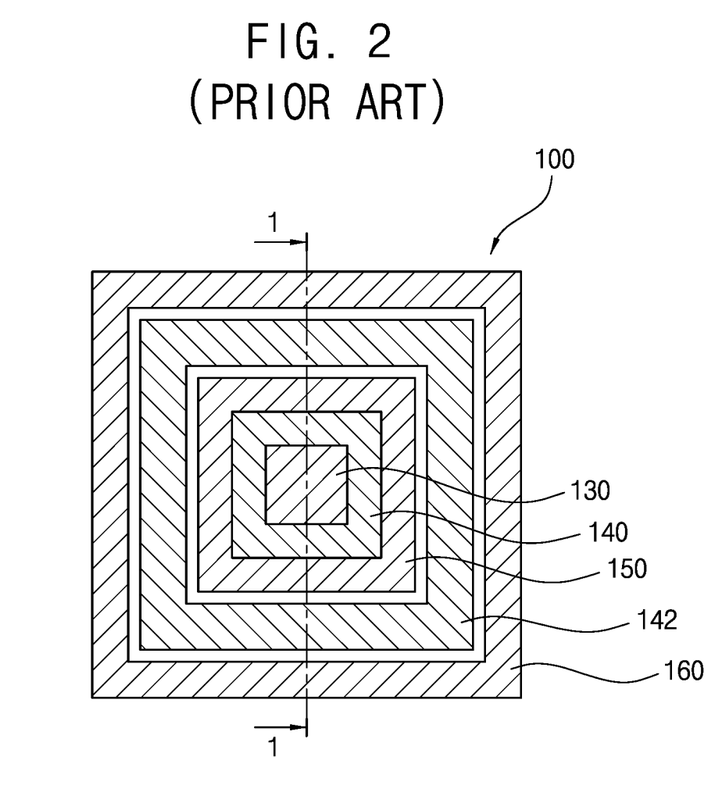
FIG. 2 is a horizontal cross-sectional view illustrating an emitter region, a base region, and a collector region as shown in FIG. 1 (the prior art), with the reference plane for the view of FIG. 1 being indicated as line 1-1.

Referring to FIGS. 1 and 2, a conventional bipolar junction transistor of the prior art is shown. A conventional bipolar junction transistor 100 may include an emitter region 130 formed in a substrate 110, a ring-shaped base region 140 configured to at least partially surround the emitter region 130 and a ring-shaped collector region 150 configured to at least partially surround the base region 140. Further, the conventional bipolar junction transistor 100 may include a ring-shaped second base region 142 configured to at least partially surround the collector region 150, and the base region 140 and the second base region 142 may be electrically connected by a deep well region 120. An emitter contact region 132, a base contact region 144, and a collector contact region 152 may be disposed on the emitter region 130, the second base region 142, and the collector region 150, respectively.

The conventional bipolar junction transistor 100 may include a ring-shaped second well region 160 configured to at least partially surround the second base region 142, and a well contact region 162 disposed on the second well region 160. The second well region 160 and the well contact region 162 may be used to apply a bias voltage to the substrate 110. Further, device isolation regions 170 may be disposed between the emitter contact region 132, the collector contact region 152, the base contact region 144 and the well contact region 162.

An insulating layer 182 may be disposed on the substrate 110, and metal wiring 186 may be disposed on the insulating layer 182. The emitter contact region 132, the collector contact region 152, the base contact region 144, and the well contact region 162 may be connected with the metal wiring 186 by metal silicide patterns 180 and contact plugs 184.

Figure 3:
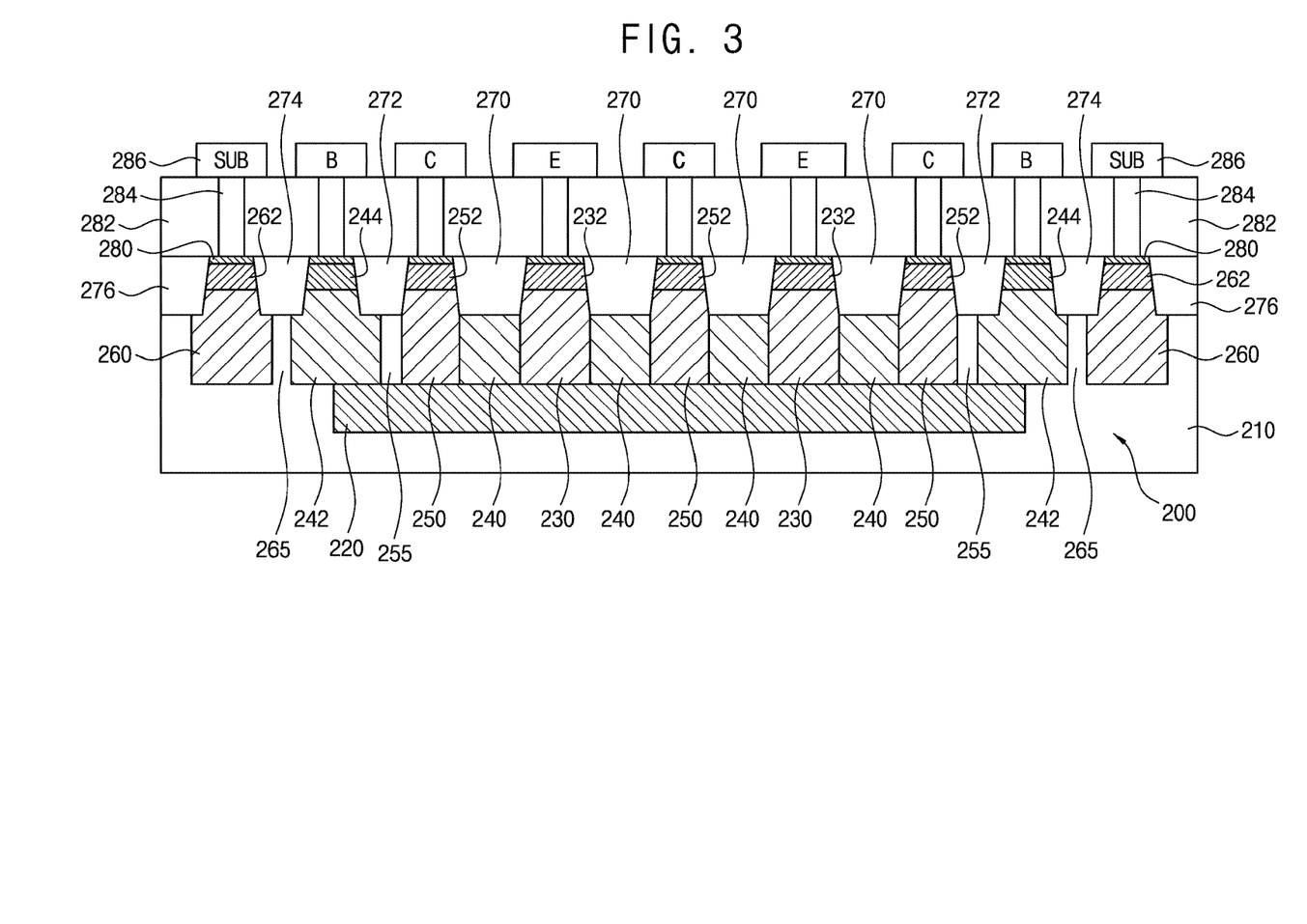
FIG. 3 is a vertical cross-sectional view illustrating a bipolar junction transistor in accordance with an exemplary embodiment of the present disclosure.
Figure 4:
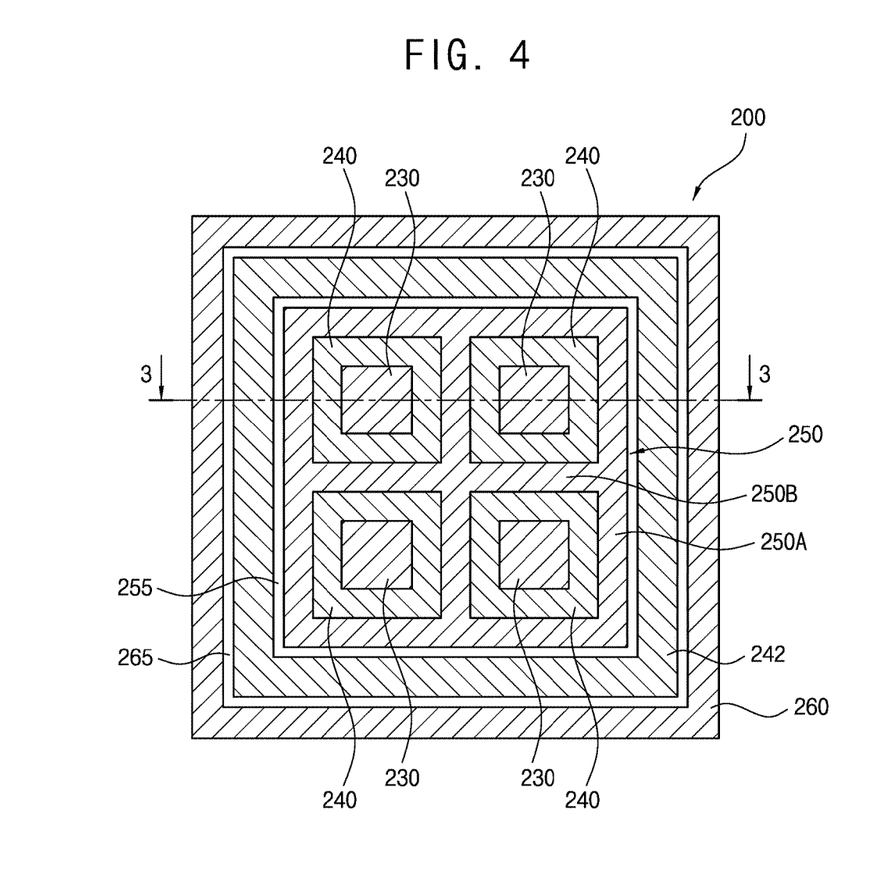
FIG. 4 is a horizontal cross-sectional view illustrating emitter regions, base regions, and a collector region as shown in FIG. 3, with the reference plane for the view of FIG. 3 being indicated as line 3-3.

Referring to FIGS. 3 and 4, in accordance with an exemplary embodiment of the present disclosure, a bipolar junction transistor 200 may include a plurality of emitter regions 230 disposed in a substrate 210, a plurality of first base regions 240 disposed in the substrate 210, with each of the plurality of base regions configured to at least partially surround a respective emitter region 230, respectively, and a collector region 250 disposed in the substrate 210 and configured to at least partially surround the plurality of first base regions 240.

In an embodiment, the plurality of emitter regions 230 and the collector region 250 may have a first conductivity type, and the first base regions 240 may have a second conductivity type. For example, a plurality of first p-type impurity regions used as the emitter regions 230 may be formed in the substrate 210, and a plurality of first n-type impurity regions used as the first base regions 240 may be formed in the substrate 210 to at least partially surround the first p-type impurity regions used as the emitter regions 230, respectively. Further, a second p-type impurity region used as the collector region 250 may be formed in the substrate 210 to at least partially surround the first n-type impurity regions used as the first base regions 240. Those skilled in the art will understand this to be an NPN transistor configuration.

In an embodiment, the substrate 210 may have the first conductivity type. For example, the emitter regions 230, the first base regions 240 and the collector region 250 may be formed in a p-type substrate used as the substrate 210.

In an alternative embodiment, a p-type epitaxial layer may be formed on the substrate 210. In this alternative embodiment, the emitter regions 230, the first base regions 240, and the collector region 250 may be formed in the p-type epitaxial layer.

In a different embodiment, n-type emitter regions 230, p-type first base regions 240, and an n-type collector region 250 may be formed in an n-type substrate or an n-type epitaxial layer. In this different embodiment, the conductivity types are reversed and those skilled in the art will understand this to be a PNP transistor configuration.

In accordance with an exemplary embodiment of the present disclosure, the emitter regions 230 may be arranged in a matrix form, and the first base regions 240 may have a ring shape surrounding the emitter regions 230, respectively. As used in this setting, the term "ring shape" is taken to mean that one region surrounds another in the electrical plane with regard to conductivity, with the physical form of the "ring shape" being any shape that generally fulfills this requirement. Accordingly, the "ring shape" is illustrated in this disclosure as being generally square, but neither a square nor a round shape are limiting. Further, the collector regions 250 may include an outer portion 250A formed to surround outer portions of the first base regions 240, and an inner portion 250B formed between the first base regions 240, as shown in more detail with respect to FIG. 4.

In the embodiment depicted in FIG. 4, four emitter regions 230 may be arranged in a 2×2 matrix form, and four first base regions 240 may be formed such that each of the four first base regions 240 surrounds an emitter region 230, respectively. The collector region 250 may include a ring-shaped outer portion 250A surrounding outer portions of the first base regions 240, and a cross-shaped inner portion 250B disposed between the first base regions 240. As used in this setting, the term "ring shape" is taken to mean that one region surrounds another in the electrical plane with regard to conductivity, with the physical form of the "ring shape" being any shape that generally fulfills this requirement. Accordingly, the "ring shape" is illustrated in this disclosure as being generally square, but neither a square nor a round shape are limiting. Similarly, the term "cross shape" that is used to describe the inner portion 250B of collector region 250 means that inner portion 250B divides the plurality of first base regions 240 from one another by generally resembling a cross in its shape.

In the embodiment depicted in FIG. 4, the bipolar junction transistor 200 may have PN junctions between the emitter regions 230 and the first base regions 240, and also PN junctions between the collector region 250 and the first base regions 240. It is noteworthy that the PN junction area of the bipolar junction transistor 200 may be increased in proportion to the number of the emitter regions 230, thereby improving the current gain (hfe) of the bipolar junction transistor 200.

In an embodiment, the emitter regions 230, the first base regions 240, and the collector region 250 may be disposed on the same plane. That is, each of the plurality of first base regions 240 may be formed to surround the side surfaces of each of the plurality of emitter regions 230 within the plane, and the collector region 250 may be formed to surround side surfaces of the plurality of first base regions 240 within the plane, as shown in FIGS. 3 and 4.

In accordance with an exemplary embodiment of the present disclosure, the bipolar junction transistor 200 may include a second base region 242 formed to surround the collector region 250 within the plane, with the second base region 242 being electrically connected to each of the plurality of first base regions 240. In an embodiment, the second base region 242 may have a ring-shape and the second base region 242 may be separated from the collector region 250 by a gap 255. The gap 255 may be a portion of the substrate 210, or it may be formed from a dielectric material.

In an embodiment, the second base region 242 may be electrically connected to each of the plurality of first base regions 240 by a first well region 220. In an embodiment, the first well region 220 may be formed in the substrate 210, and the plurality of first base regions 240 and the second base region 242 may then be formed on the first well region 220. Accordingly, the plurality of emitter regions 230 and the collector region 250 may also be formed on the first well region 220.

In an embodiment, the second base region 242 and the first well region 220 may have the second conductivity type. For example, a deep n-type well region used as the first well region 220 may be formed in the substrate 210, and a second n-type impurity region used as the second base region 242 may be formed on the first well region 220 to surround the collector region 250. In this embodiment, the second base region 242 may be formed on an edge portion of the first well region 220, with the second base region 242 having a ring shape as shown in FIGS. 3 and 4. As used in this setting, the term "ring shape" is taken to mean that one region surrounds another in the electrical plane with regard to conductivity, with the physical form of the "ring shape" being any shape that generally fulfills this requirement. Accordingly, the "ring shape" is illustrated in this disclosure as being generally rectangular or square, but neither a square nor a round shape are limiting.

In an embodiment, a plurality of emitter contact regions 232 may be utilized, with an emitter contact region 232 being disposed on each emitter region 230. Additionally, a collector contact region 252 may be disposed on the collector region 250. Further, a base contact region 244 may be disposed on the second base region 242. In this embodiment, the second base region 242 and the first well region 220 may electrically connect the base contact region 244 with the plurality of first base regions 240.

In an embodiment, first p-type high concentration impurity regions functioning as the emitter contact regions 232 may be formed on each of the emitter regions 230, and a second p-type high concentration impurity region functioning as the collector contact region 252 may be formed on the collector region 250. Further, an n-type high concentration impurity region functioning as the base contact region 244 may be formed on the second base region 242.

In an embodiment, the bipolar junction transistor 200 may include a second well region 260 formed to surround the second base region 242, and a well contact region 262 formed on the second well region 260. The second well region 260 and the well contact region 262 may have the first conductivity type, and may be used to apply a bias voltage to the substrate 210. In an embodiment, a third p-type impurity region used as the second well region 260 may be formed to surround the second base region 242, and a third p-type high concentration impurity region used as the well contact region 262 may be formed on the second well region 260. The second well region 260 may be separated from the second base region 242 by a second gap 265. The second gap 265 may be a portion of the substrate 210, or it may be formed from a dielectric material.

In an embodiment, a first device isolation region 270 may be disposed between the emitter contact regions 232 and the collector contact region 252, and a second device isolation region 272 may be disposed between the collector contact region 252 and the base contact region 244. In an embodiment, each of the first device isolation regions 270 may have a ring-shape corresponding to each of the plurality of first base regions 240, and each of the first device isolation regions 270 may be disposed on each of the plurality of first base regions 240, respectively. The second device isolation region 272 may have a ring shape surrounding the collector contact region 252.

In an embodiment, a third device isolation region 274 may be disposed between the base contact region 244 and the well contact region 262. The third device isolation region 274 may have a ring shape surrounding the base contact region 244. Further, a fourth device isolation region 276 may have a ring shape and may be disposed to surround the well contact region 262.

In an embodiment, the emitter contact regions 232, the collector contact region 252, the base contact region 244, the well contact region 262, the first device isolation region 270, second device isolation region 272, third device isolation region 274, and fourth device isolation region 276 may be formed at surface portions of the substrate 210. Metal silicide patterns 280 may be formed on the emitter contact regions 232, the collector contact region 252, the base contact region 244, and the well contact region 262. In an embodiment, cobalt silicide may be used for the metal silicide patterns 280. Those who are skilled in the art are familiar with various material compositions that are used for making metal silicide patterns.

In an embodiment, an insulating layer 282 may be formed on the substrate 210, and metal wiring 286 may be formed on the insulating layer 282. The metal wiring 286 may be electrically connected with the emitter contact regions 232, the collector contact region 252, the base contact region 244, and the well contact region 262 by a plurality of contact plugs 284.

FIGS. 5 to 8 are vertical cross-sectional views illustrating a method of manufacturing the bipolar junction transistor of FIGS. 3 and 4.

Figure 5:
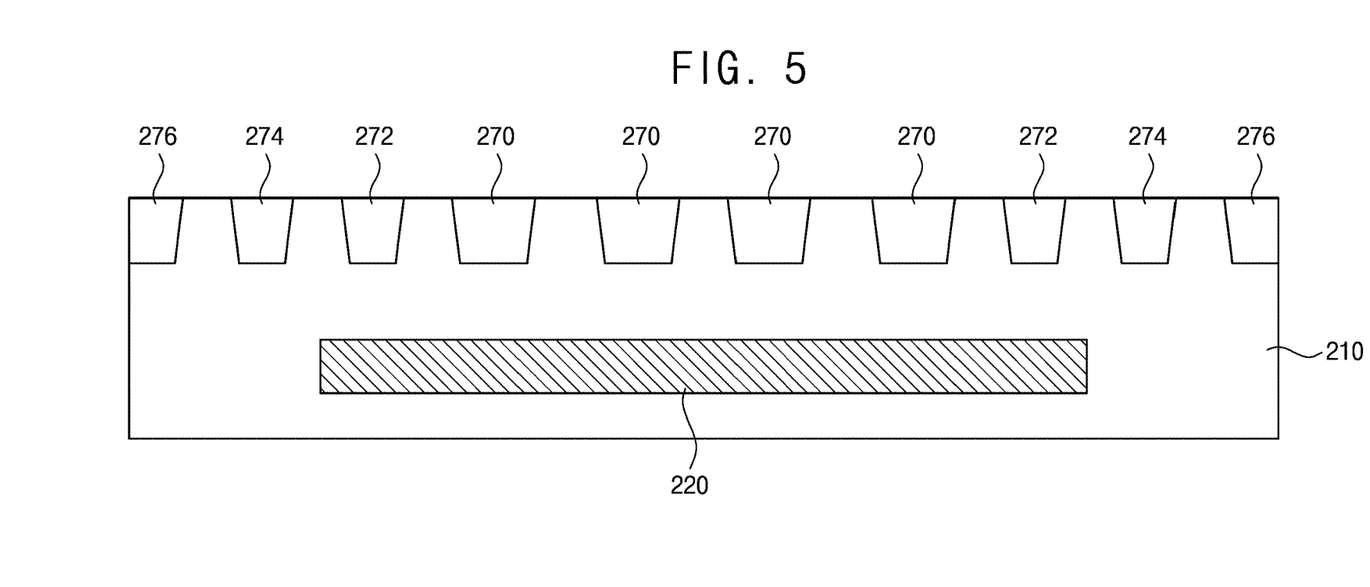
FIGS. 5 to 8 are vertical cross-sectional views illustrating a method of manufacturing the bipolar junction transistor as shown in FIG. 3.

Referring to FIG. 5, a first well region 220 of a second conductivity type may be formed in a substrate 210 of a first conductivity type. In an embodiment, a deep n-type well region functioning as the first well region 220 may be formed in a p-type substrate 210 by an ion implantation process.

In an embodiment, first device isolation region 270, second device isolation region 272, third device isolation region 274, and fourth device isolation region 276 may be formed at surface portions of the substrate 210. The first device isolation region 270, second device isolation region 272, third device isolation region 274, and fourth device isolation region 276 may be used to electrically isolate emitter contact regions 232, a collector contact region 252, a base contact region 244, and a well contact region 262 from one another. For example, a plurality of first device isolation regions 270, a second device isolation region 272 surrounding the first device isolation regions 270, a third device isolation region 274 surrounding the second device isolation region 272, and a fourth device isolation region 276 surrounding the third device isolation region 274 may be formed at the surface portions of the substrate 210. The first device isolation regions 270 may have a ring shape and may be arranged in a matrix form.

In an embodiment, the first device isolation region 270, second device isolation region 272, third device isolation region 274, and fourth device isolation region 276 may be formed by a shallow trench isolation (STI) process. For example, a plurality of trenches may be formed at the surface portions of the substrate 210, and the first to fourth device isolation regions 270, 272, 274, and 276 may then be formed by filling the trenches with a dielectric material such as silicon oxide or silicon oxynitride.

Figure 6:
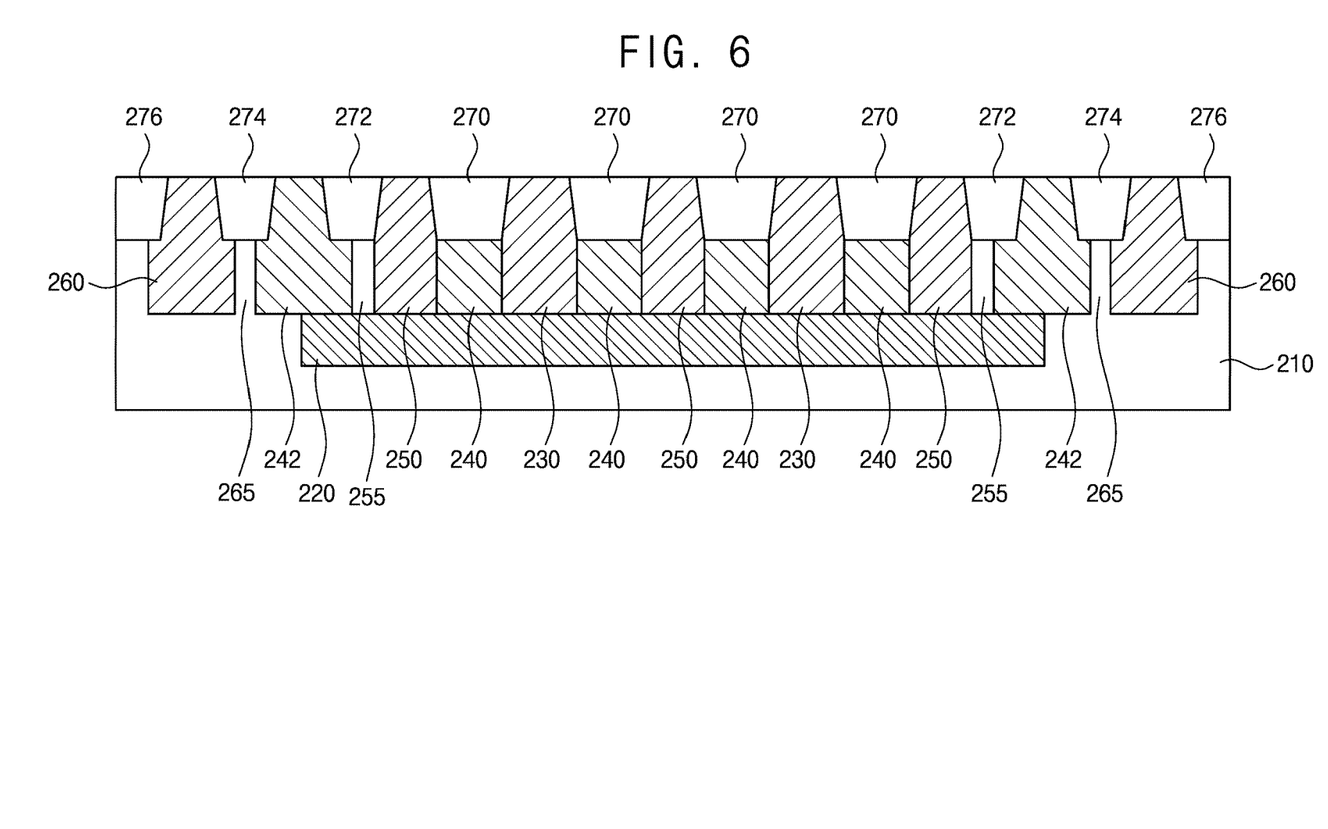

Referring to FIG. 6, a plurality of first base regions 240 may be formed, each first base region 240 being configured to surround each of the plurality of emitter regions 230. A collector region 250 may be formed in the substrate 210, with the collector region 250 being configured to surround the first base regions 240.

In an embodiment, the plurality of emitter regions 230 and the collector region 250 may have the first conductivity type. For example, a first p-type impurity regions used as the emitter regions 230 and a second p-type impurity region used as the collector region 250 may be formed on the first well region 220. In an embodiment, the plurality of emitter regions 230 may be arranged in a matrix form. In an embodiment, the plurality of emitter regions 230 and the collector region 250 may be simultaneously formed by using an ion implantation process. Those who are skilled in the art are familiar with the use of ion implantation processes for manufacturing semiconductor devices.

In an embodiment, the plurality of first base regions 240 may have the second conductivity type. For example, first n-type impurity regions used as the first base regions 240 may be formed on the first well region 220. The plurality of first base regions 240 may be formed on the first well region 220 by an ion implantation process.

In an embodiment, the plurality of first base regions 240 may be formed under the plurality of first device isolation regions 270, with each first base region 240 being formed under a first device isolation region 270. Each emitter region 230 may be formed inside a first base region 240, and the collector region 250 may be formed outside the plurality of first base regions 240. That is, the emitter regions 230 may be arranged inside the first device isolation regions 270, and the collector region 250 may be arranged between the first device isolation regions 270 and the second device isolation region 272.

In an embodiment, a second base region 242 may be formed in the substrate 210 to surround the collector region 250. The second base region 242 may be arranged between the second device isolation region 272 and third device isolation region 274. In an embodiment, the second base region 242 may have the second conductivity type, and the second base region 242 may be formed with the first base region 240. In an embodiment, a second n-type impurity region used as the second base region 242 may be formed on an edge portion of the first well region 220, and thus the first base region 240 may be electrically connected with the second base region 242 through the first well region 220. In an embodiment, the second base region 242 may be electrically isolated from the collector region 250 by a gap 255.

In an embodiment, a second well region 260 may be formed in the substrate 210 to surround the second base region 242. The second well region 260 may be arranged between the third device isolation region 274 and fourth device isolation region 276. In an embodiment, the second well region 260 may have the first conductivity type, and the second well region 260 may be formed with the plurality of emitter regions 230 and the collector region 250. In an embodiment, a third p-type impurity region used as the second well region 260 may be formed in the substrate 210 to surround the second base region 242.

Figure 7:
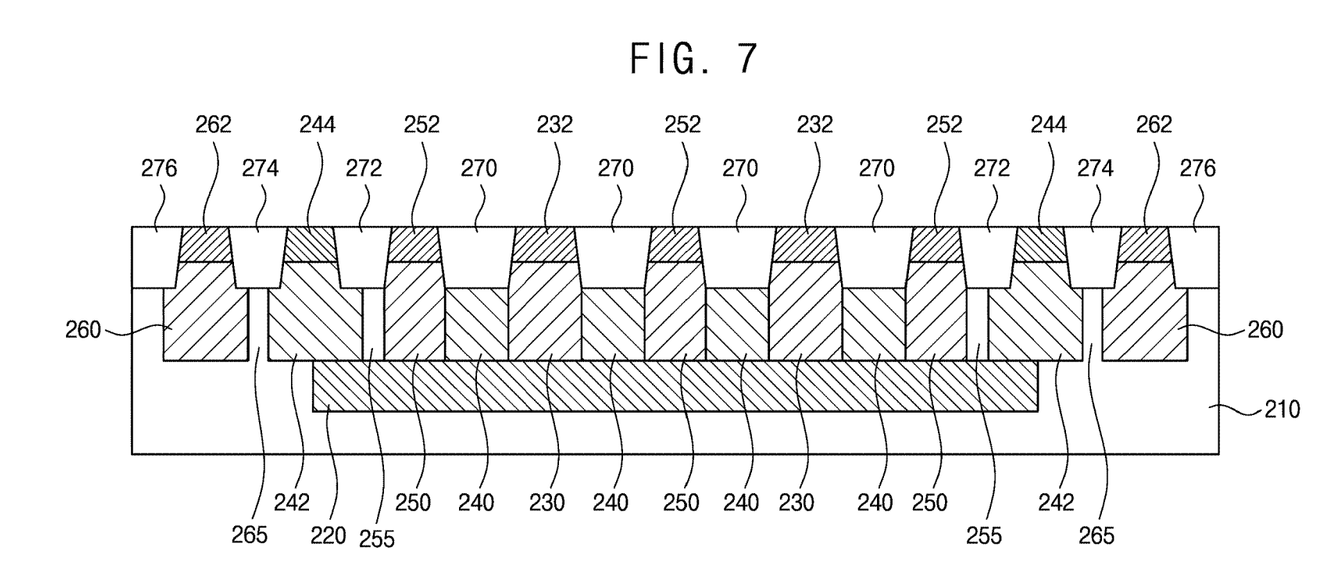

Referring to FIG. 7, the plurality of emitter contact regions 232 may be formed on the plurality of emitter regions 230, with each emitter contact region 232 being formed on each emitter region 230. In an embodiment, the collector contact region 252 may be formed on the collector region 250, and the well contact region 262 may be formed on the second well region 260.

In an embodiment, the emitter contact regions 232, the collector contact region 252, and the well contact region 262 may have the first conductivity type. The emitter contact regions 232, the collector contact region 252, and the well contact region 262 may be formed by an ion implantation process. For example, p-type high concentration impurity regions used as the emitter contact regions 232, the collector contact region 252, and the well contact region 262 may be formed on the emitter regions 230, the collector region 250 and the second sell region 260.

In an embodiment, the emitter contact regions 232 may be arranged inside the first device isolation regions 270, and the collector contact region 252 may be arranged between the first device isolation regions 270 and the second device isolation region 272. The well contact region 262 may be arranged between the third device isolation region 274 and the fourth device isolation region 276.

In an embodiment, the base contact region 244 may be formed on the second base region 242. The base contact region 244 may have the second conductivity type and may be formed by an ion implantation process. For example, an n-type high concentration impurity region used as the base contact region 244 may be formed on the second base region 242. The base contact region 244 may be disposed between the second device isolation region 272 and the third device isolation region 274.

Figure 8:
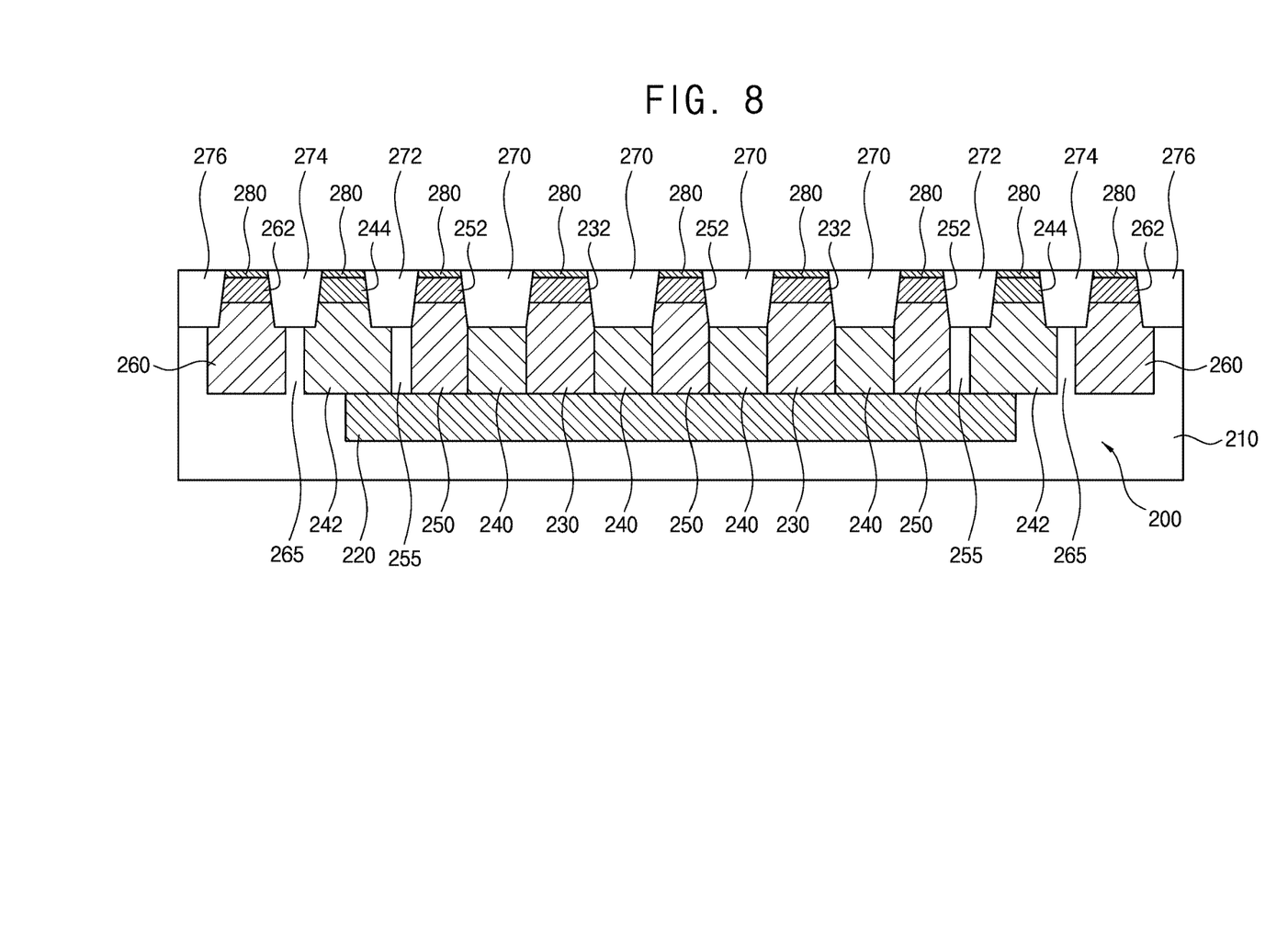

Referring to FIG. 8, metal silicide patterns 280 may be formed on the emitter contact regions 232, the collector contact region 252, the base contact region 244, and the well contact region 262. In an embodiment, cobalt silicide may be used for the metal silicide, and cobalt silicide patterns may be formed on the emitter contact regions 232, the collector contact region 252, the base contact region 244, and the well contact region 262. Those skilled in the art are familiar with the use of a metal silicidation process.

After forming the metal silicide patterns 280, an insulating layer 282, may be formed on the substrate 210 as shown in FIG. 3. In an embodiment, the insulating layer may be comprised of silicon oxide. Further, contact plugs 284 may be formed through the insulating layer 282 to be connected with the metal silicide patterns 280, and metal wiring 286 may be formed on the insulting layer 282 and the contact plugs 284.

In accordance with the exemplary embodiments of the present disclosure as described above, the bipolar junction transistor 200 may include the emitter regions 230 arranged in the matrix form, the first base regions 240 configured to surround the emitter regions 230, and the collector region 250 configured to surround the first base regions 240. In the embodiment shown in FIGS. 3 through 8, the plurality of emitter regions 230 are arranged in a 2×2 matrix. In other embodiments, a greater or lesser number of emitter regions 230 may be utilized. By way of example, without limitation, a 1×2 matrix, 2×3 matrix, or 3×3 matrix may be utilized. Moreover, a number of emitter regions 230 greater than that which would exist in a 3×3 matrix is within the scope of the present disclosure.

In accordance with the exemplary embodiments of the present disclosure as described above, the bipolar junction transistor 200 is comprised of emitter regions 230 which are generally square in shape in the horizontal cross-sectional view. Other horizontal cross-sectional shapes are within the scope of the present disclosure, including without limitation shapes which are rectangular, polygonal, round, and oval. Moreover, emitter regions 230 of varying shapes and sizes may be used together in the bipolar junction transistor 200 of the present disclosure. Similarly, the shape and size of the first base regions 240 configured to surround the emitter regions 230, and the collector region 250 configured to surround the first base regions 240, may vary in shape and size while keeping within the scope of the present disclosure.

In an embodiment, the bipolar junction transistor 200 may have substantially the same PN junction area as the conventional bipolar junction transistor array including the conventional bipolar junction transistors 100. As a result, the bipolar junction transistor 200 may have a relatively reduced size and an improved current gain (hfe) in comparison with the conventional bipolar junction transistor array.

Although the bipolar junction transistor 200 and the method of manufacturing the same have been described with reference to specific embodiments, they are not limited thereto. Therefore, it will be readily understood by those skilled in the art that various modifications and changes can be made thereto without departing from the spirit and scope of the present disclosure defined by the appended claims.

The invention claimed is:

1. A bipolar junction transistor comprising:
   a well region disposed in a substrate;
   a plurality of emitter regions disposed on the well region in the substrate;
   a plurality of first base regions disposed on the well region in the substrate, each of the plurality of first base regions having a ring shape that surrounds a corresponding emitter region;
   a common collector region disposed on the well region in the substrate and comprising an outer portion having a ring shape that surrounds the plurality of first base regions and an inner portion disposed between the plurality of first base regions and connected with the outer portion;

a second base region disposed on the well region in the substrate to be electrically connected with the plurality of first base regions by the well region and having a ring shape that surrounds the common collector region;

a plurality of emitter contact regions disposed on the plurality of emitter regions;

a collector contact region disposed on the collector region; and a base contact region disposed on the second base region.

2. The bipolar junction transistor of claim 1, wherein the plurality of emitter regions are arranged in a matrix form.

3. The bipolar junction transistor of claim 2, wherein:

four emitter regions are arranged in a 2×2 matrix form;

the inner portion of the common collector region has a cross shape disposed between the plurality of first base regions.

4. The bipolar junction transistor of claim 1, further comprising a plurality of device isolation regions, each device isolation region being disposed on a corresponding first base region.

5. The bipolar junction transistor of claim 1, further comprising a second well region configured to surround the second base region.

6. The bipolar junction transistor of claim 5, further comprising a well contact region disposed on the second well region.

7. The bipolar junction transistor of claim 6, further comprising a third device isolation region disposed between the base contact region and the well contact region.

8. The bipolar junction transistor of claim 1, further comprising a plurality of device isolation regions disposed between the plurality of emitter contact regions and the collector contact region.

9. The bipolar junction transistor of claim 1, further comprising a second device isolation region disposed between the collector contact region and the base contact region.

10. A method of manufacturing a bipolar junction transistor comprising:

forming a well region in a substrate;

forming a plurality of emitter regions on the well region in the substrate;

forming a plurality of first base regions on the well region in the substrate, wherein each of the plurality of first base regions has a ring shape that surrounds a corresponding emitter region;

forming a common collector region on the well region in the substrate, wherein the common collector region comprises an outer portion having a ring shape that surrounds the plurality of first base regions and an inner portion disposed between the plurality of first base regions and connected with the outer portion;

forming a second base region on the well region in the substrate to be electrically connected with the plurality of first base regions by the well region and having a ring shape that surrounds the common collector region;

forming a plurality of emitter contact regions on the plurality of emitter regions;

forming a collector contact region on the collector region; and forming a base contact region on the second base region.

11. The method of claim 10, wherein the plurality of first base regions and the second base region are formed simultaneously.

12. The method of claim 10, further comprising forming a second well region in the substrate to surround the second base region, wherein the plurality of emitter regions, the collector region, and the second well region are formed simultaneously.

13. The method of claim 12, further comprising forming a well contact region on the second well region.

14. The method of claim 13, further comprising forming a third device isolation region between the base contact region and the well contact region.

15. The method of claim 10, wherein the plurality of emitter contact regions and the collector contact region are formed simultaneously.

16. The method of claim 10, further comprising forming a plurality of device isolation regions between the plurality of emitter contact regions and the collector contact region.

17. The method of claim 10, further comprising forming a second device isolation region between the collector contact region and the base contact region.

* * * * *